(12) United States Patent
Liu et al.

(10) Patent No.: US 8,841,732 B2
(45) Date of Patent: Sep. 23, 2014

(54) SELF-ADJUSTING LATCH-UP RESISTANCE FOR CMOS DEVICES

(75) Inventors: Yanxiang Liu, Wappingers Falls, NY (US); Xiaodong Yang, Hopewell Junction, NY (US); Gan Wang, Fishkill, NY (US)

(73) Assignees: Globalfoundries, Inc., Grand Cayman (KY); International Business Machines Corporation, Armonk, NY (US)

( * ) Notice: Subject to any disclaimer, the term of this patent is extended or adjusted under 35 U.S.C. 154(b) by 146 days.

(21) Appl. No.: 13/197,631

(22) Filed: Aug. 3, 2011

(65) Prior Publication Data

US 2013/0032890 A1 Feb. 7, 2013

(51) Int. Cl.
*H01L 27/092* (2006.01)

(52) U.S. Cl.
USPC .......................................... 257/372; 257/371

(58) Field of Classification Search
CPC .................................................. H01L 27/0921
USPC .......... 257/139–145, 147–153, 372–376, 371
See application file for complete search history.

(56) References Cited

U.S. PATENT DOCUMENTS

| | | | | |
|---|---|---|---|---|
| 7,696,564 | B1 * | 4/2010 | Liao et al. ...................... | 257/328 |
| 2002/0117732 | A1 * | 8/2002 | Letor et al. ..................... | 257/577 |
| 2004/0092042 | A1 * | 5/2004 | Higgs ............................. | 438/14 |
| 2006/0202307 | A1 * | 9/2006 | Kapoor .......................... | 257/565 |
| 2006/0244060 | A1 * | 11/2006 | Kapels et al. .................. | 257/341 |
| 2008/0191291 | A1 * | 8/2008 | Wu et al. ....................... | 257/409 |
| 2008/0203522 | A1 * | 8/2008 | Mandelman et al. ......... | 257/509 |
| 2008/0237706 | A1 * | 10/2008 | Williams et al. .............. | 257/343 |
| 2010/0213543 | A1 * | 8/2010 | Zhang et al. .................. | 257/335 |
| 2010/0213544 | A1 * | 8/2010 | Liu et al. ....................... | 257/339 |

FOREIGN PATENT DOCUMENTS

JP 2004-363358 * 12/2004

OTHER PUBLICATIONS

Xiao et al., "Incomplete ionization in a semiconductor and its implications to device modeling", Microelectronics Reliability 39 (1999) 1299-1303.*
Schenk et al., "Physical Model of Incomplete Ionization for Silicon Device Simulation," Simulation of Semiconductor Processes and Devices, 2006 International Conference on , vol., No., pp. 51,54, Sep. 6-8, 2006.*
Berman et al.,"Magnetic Resonance Force Microscopy Quantum Computer with Tellurium Donors in Silicon", Physical Review Letters, vol. 86(13), p. 2894 (2001).*

* cited by examiner

*Primary Examiner* — Fernando L Toledo
*Assistant Examiner* — Peter Bradford
(74) *Attorney, Agent, or Firm* — Ingrassia Fisher & Lorenz, P.C.

(57) ABSTRACT

CMOS devices (60, 61, 61') having improved latch-up robustness are provided by including with one or both WELL regions (22, 29) underlying the source-drains (24, 25; 31, 32) and the body contacts (27, 34), one or more further regions (62, 62', 62-2) doped with deep acceptors or deep donors (or both) of the same conductivity type as the corresponding WELL region and whose ionization substantially increases as operating temperature increases. The increase in conductivity exhibited by these further regions as a result of the increasing ionization of the deep acceptors or donors off-sets, in whole or part, the temperature driven increase in gain of the parasitic NPN and/or PNP bipolar transistors inherent in prior art CMOS structures. By clamping or lowering the gain of the parasitic bipolar transistors, the CMOS devices (60, 61, 61') are less likely to go into latch-up with increasing operating temperature.

13 Claims, 4 Drawing Sheets

US 8,841,732 B2

SELF-ADJUSTING LATCH-UP RESISTANCE FOR CMOS DEVICES

FIELD OF THE INVENTION

This invention relates generally to structures and methods for complementary metal-oxide-semiconductor (CMOS) devices and integrated circuits (ICs) with improved latch-up resistance.

BACKGROUND OF THE INVENTION

The terms "metal-oxide-semiconductor" (MOS) and "complementary metal-oxide-semiconductor" (CMOS) are widely used to refer to insulated gate field effect transistors (IGFETs) employing any type of gate conductor, not just metals, and any type of gate insulator, not just oxides, and such broader usage is intended herein.

It is known that CMOS devices are subject to "latch-up", a phenomenon wherein under certain operating conditions, the CMOS device can switch from normal operation to a persistent conductive state that is insensitive to the input voltage applied to the control terminal of the CMOS device. Often, latch-up can only be relieved by interrupting the power supply to the CMOS device which, if undamaged, may recover and resume normal operation. Latch-up arises as a consequence of the parasitic NPN and PNP bipolar transistors that are inherent in the CMOS device structure (e.g., see FIG. 1). Many events such as voltage transients, radiation, increasing temperature, and so forth, can trigger latch-up and much effort has been expended in trying to make CMOS devices more robust in their ability to resist latch-up without adverse effect on other device properties. This has proved to be a difficult problem, especially as CMOS device dimensions have been shrunk for use in ever denser and more complex ICs. An especially persistent problem has been latch-up temperature sensitivity. Other things being equal, as device temperature increases, latch-up becomes more likely, which is undesirable. Thus, there is an ongoing need to improve CMOS latch-up robustness for higher device temperatures.

BRIEF SUMMARY OF THE INVENTION

CMOS devices (60, 61, 61') having improved latch-up robustness are provided by including with one or both CMOS WELL regions (22, 29) underlying the source-drains (24, 25; 31, 32) and the body contacts (27, 34), one or more further regions (62, 62', 62-2) doped with deep acceptors or deep donors (or both) of the same conductivity type as the WELL regions (22, 29) and whose ionization substantially increases as device temperature increases over the operating range of the CMOS device. The increase in conductivity exhibited by these further regions as a result of the increasing ionization of the deep acceptors or donors, off-sets in whole or part, the temperature driven increase in gain of the parasitic NPN and/or PNP bipolar transistors inherent in prior art CMOS structures. By clamping or lowering the gain of the parasitic bipolar transistors, the CMOS devices (60, 61, 61') are less likely to go into latch-up with increasing operating temperature. Other desirable features and characteristics of the present invention will become apparent from the subsequent detailed description and the appended claims, taken in conjunction with the accompanying drawings and the foregoing technical field and background.

BRIEF DESCRIPTION OF THE DRAWINGS

The invention will be better understood from a reading of the following detailed description, taken in conjunction with the accompanying figures in the drawings in which like numerals denote like or analogous elements, and wherein.

DETAILED DESCRIPTION OF THE INVENTION

Figure 1:
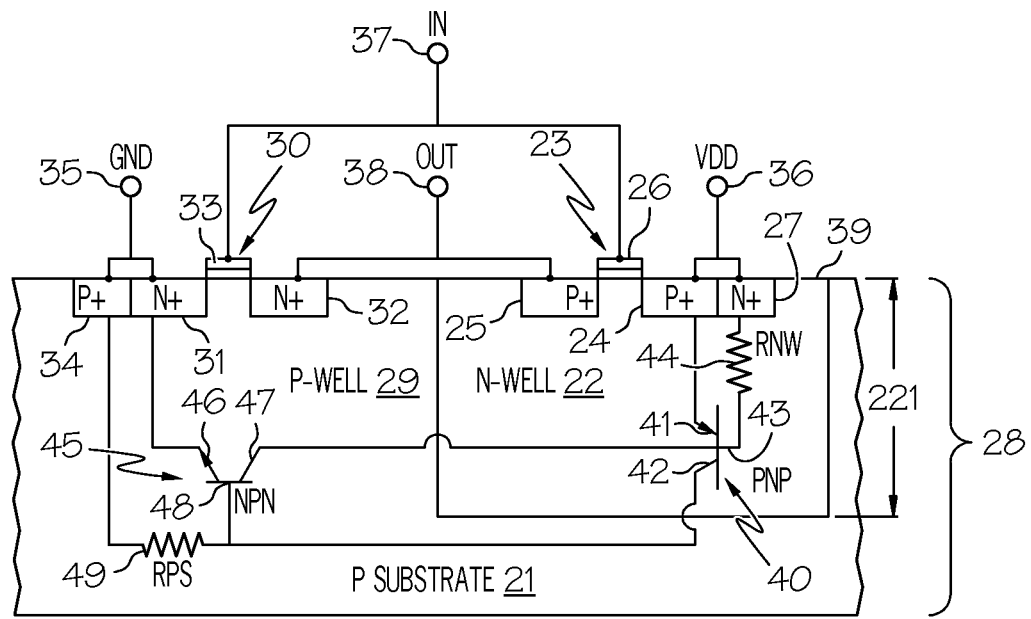
FIG. 1 shows a simplified cross-sectional view of a typical prior art CMOS device, overlain by schematic representations of the parasitic NPN bipolar transistor and PNP bipolar transistor inherent in such CMOS device.

The following detailed description is merely exemplary in nature and is not intended to limit the invention or the application and uses of the invention. Furthermore, there is no intention to be bound by any expressed or implied theory presented in the preceding technical field, background, or the following detailed description. For simplicity and clarity of illustration, the drawing figures illustrate the general manner of construction, and descriptions and details of well-known features and techniques may be omitted to avoid unnecessarily obscuring the invention. Additionally, elements in the drawings figures are not necessarily drawn to scale. For example, the dimensions of some of the elements or regions in the figures may be exaggerated relative to other elements or regions to help improve understanding of embodiments of the invention.

The terms "comprise," "include," "have" and any variations thereof, are intended to cover non-exclusive inclusions, such that a process, method, article, or apparatus that comprises a list of elements or steps is not necessarily limited to those elements or steps, but may include other elements or steps not expressly listed or inherent to such process, method, article, or apparatus. The term "coupled," as used herein, is defined as directly or indirectly connected in an electrical or non-electrical manner. As used herein the terms "substantial" and "substantially" mean sufficient to accomplish the stated purpose in a practical manner and that minor imperfections, if any, are not significant for the stated purpose. Furthermore, the terms "first," "second," "third," "fourth" and the like in the description and the claims, if any, may be used for distinguishing between somewhat similar elements and not necessarily for describing a particular spatial arrangement or sequence or chronological order. It is to be understood that the terms so used are interchangeable under appropriate circumstances such that the embodiments of the invention described herein are, for example, capable of operation or construction in sequences, orientations and arrangements other than those illustrated or otherwise described herein.

The drawings and associated discussion illustrate CMOS devices formed in and on semiconductor material on supporting substrates. As used herein, the term "semiconductor", singular or plural, is intended to include any kind of semiconductor material, including but not limited to single crystal semiconductors, polycrystalline semiconductors, amorphous semiconductors as well as organic and inorganic semiconductors. As used herein, the term "substrate", singular or plural is intended to include bulk semiconductor substrates, insulating substrates, and combinations thereof such as but not intended to be limiting, semiconductor-on-insulator (SOI) substrates and insulator-on-semiconductor (IOS) substrates. Substrates may be single crystal, polycrystalline, amorphous, laminated or combinations thereof. For convenience of description, various conductors may be referred to as "metals", but it should be understood that the words "metal" and "conductor", singular or plural, are used interchangeably herein to include any type of electrical conductor, whether metallic or not. Semiconductors, doped semiconductors, metals, semi-metals, metal alloys, semiconductor-metal alloys and combinations thereof are non-limiting examples of useful electrical conductors. For convenience of explanation and not intended to be limiting, embodiments of the invention are described for CMOS devices embodying silicon semiconductor, but persons of skill in the art will understand based on the explanations herein that other semiconductor materials may also be used.

FIG. 1 shows a simplified cross-sectional view of typical prior art CMOS device 20, overlain by schematic representations of parasitic NPN bipolar transistor 45 and PNP bipolar transistor 40 inherent in such CMOS device. CMOS device 20 is formed in and on semiconductor (SC) body 28. SC body 28 includes, in this example, P-type substrate 21, N-WELL 22 and P-WELL 29. P-WELL 29 may be a part of P-type substrate 21 or may be separately formed or both. Located within N-WELL 22 is P-channel MOS device 23 with P+ source region 24, P+ drain region 25 laterally spaced from source region 24, N+ contact 27 to N-WELL 22 and conductive gate 26 overlying and insulated from SC surface 39 so that, when appropriately biased, gate 26 induces a conductive channel in SC body 28 between source 24 and drain 25. Located within P-WELL 29 is N-channel MOS device 30 with N+ source region 31, N+ drain region 32 laterally spaced from source region 31, P+ contact 34 to P-WELL 29 and conductive gate 33 overlying and insulated from SC surface 39 so that, when appropriately biased, gate 33 induces a conductive channel in SC body 28 between source 31 and drain 32. In a typical arrangement, P+ body contact 34 and N+ source 31 are tied together and to reference (e.g., GND) connection 35, conductive gates 33, 23 are tied together and to input connection (IN) 37, N+ drain 32 and P+ drain 25 are tied together and to output connection (OUT) 38, and P+ source 24 and N+ body contact 27 are tied together and to voltage source (e.g., Vdd) connection 36.

Parasitic PNP bipolar transistor 40 has emitter 41 formed by P+ source 24, P-type collector 42 formed by P-type substrate 21 (and/or P-WELL 29) and base 43 formed by N-WELL 22. N-WELL resistance (Rnw) 44 exists between N+ body contact 27 and base 43 of PNP transistor 40. Parasitic NPN bipolar transistor 40 has emitter 46 formed by N+ source 31, N-type collector 47 formed by N-WELL 22 and base 48 formed by P-WELL 29 and P-type substrate 21. P-WELL resistance (Rps) 49 exists between P+ body contact 34 and base 48 of NPN transistor 45. The propensity of CMOS device 20 to enter latch-up depends sensitively on the gain of parasitic transistors 40, 45, the higher the gain of one or both transistors, the more easily latch-up occurs. Stated another way, the higher the gain of one or both of parasitic transistors 40, 45, the less latch-up robust is CMOS device 20. The gains of parasitic bipolar transistors 40, 45 are temperature dependent. Other things being equal, the higher the device temperature, the higher the parasitic transistor gain and the less latch-up robust the prior art CMOS devices become.

Figure 2:
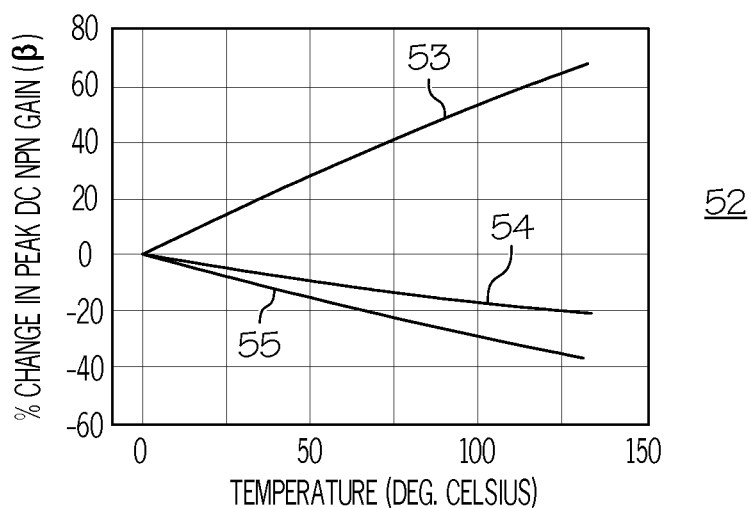
FIG. 2 shows a chart of the percent (%) change in the peak DC gain of the parasitic NPN transistor shown in FIG. 1, for a prior art CMOS device and for CMOS devices according to an embodiment of the invention illustrated in FIG. 3.

FIG. 2 shows graph 52 of the percent (%) change in the peak DC gain of parasitic NPN transistor 45 shown in FIG. 1. Trace 53 shows the results for prior art CMOS device 20 of FIG. 1 and traces 54, 55 show results for CMOS device 60 of FIG. 3 according to an embodiment of the invention to be discussed below. It will be noted in connection with trace 53 that the gain of parasitic NPN transistor 45 increases by over 50% as the device temperature increases from zero to about 100 degrees Celsius. Similar effects occur in connection with PNP parasitic transistor 40. This increase in parasitic transistor gain produces a significant reduction in the latch-up robustness of prior art CMOS device 20 of FIG. 1 with increasing temperature. As temperature increases, prior art CMOS device 20 becomes progressively less latch-up robust. This is not desirable.

Attempts have been made in the prior art to avoid the temperature dependent decrease in latch-up robustness by using retrograde doping in WELL region 22, 29. With retrograde doping, the impurity concentrations in WELL regions 20, 29 increase with depth from surface 39. This can reduce Rnw and Rps which can lower the gains of parasitic bipolar transistors 40, 45 and extend the temperature range over which latch-up is avoided. However, such retrograde doping also increases the MOSFET junction capacitance, which degrades the performance of the CMOS device even at lower temperatures where temperature dependent latch-up is not otherwise a problem. This is undesirable. Similarly, other approaches (e.g., guard rings, deep trench isolation walls, etc.) for improving the latch-up robustness of CMOS device 20 and thereby improving its allowed operating temperature range adversely affect device area and cost. Thus, a need continues to exist for improved device structures and methods that can improve CMOS device latch-up robustness, especially as a function of temperature, without significant adverse affect on other device properties and/or device area and manufacturing cost.

Figure 3:
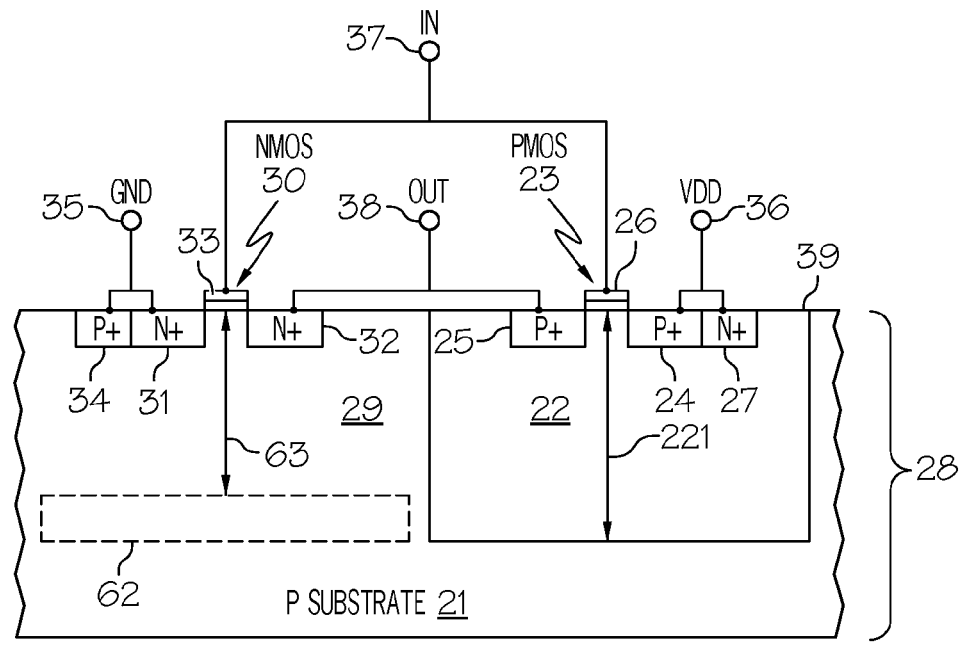
FIG. 3 shows a simplified cross-sectional view analogous to that of FIG. 1 but of a CMOS device having improved latch-up robustness for elevated temperatures, according to an embodiment of the present invention.

FIG. 3 shows a simplified cross-sectional view analogous to that of FIG. 1 of CMOS device 60 according to an embodiment of the present invention. CMOS device 60 of FIG. 3 differs from CMOS device 20 of FIG. 1 by the addition of latch-up robustness enhancing doped region 62 located, in this example, in P-WELL 29. Region 62 is generally located underlying N+ source region 31, N+ drain region 32 and P+ WELL contact region 34 at depth 63 below surface 39. Region 62 is desirably but not essentially provided by ion implantation wherein depth 63 depends on the implant energy and inherent scattering or out-diffusion of its dopant ions within P-WELL region 29. The dopant ions used to form region 62 are of the same conductivity type (e.g., acceptors) as those used to form WELL 29 and are chosen from that class of impurities that are generally only partly ionized at about room temperature and which become significantly further ionized as operating temperatures increase, and especially in temperature ranges where improved latch-up robustness is desired. This results, for example, in Rps values that change with temperature so as to overcome the prior art increase (see trace 53 of FIG. 2) in the gain of NPN parasitic transistor 45 as temperature increases. The use of doped region 62 employing deep acceptors can result in decreasing parasitic transistor gain with increasing temperature such as is illustrated by traces 54 and 55 of FIG. 2. The decrease in parasitic transistor gain results in increased latch-up robustness at higher device temperatures. Further, the adverse increase in MOSFET junction capacitance encountered with prior art retrograde doping is largely avoided at normal, non-elevated, operating temperatures because the incomplete ionization of the dopant ions used to form region 62 does not substantially increase the conductivity of region 62 at such temperatures and the associated junction capacitance is lower. Thus, increased latch-up robustness is achieved by the present invention with much less adverse affect on other device properties. This is highly desirable.

Where semiconductor (SC) body 28 is of silicon or other semiconductor of approximately comparable bandwidth, it is found that region 62 in P-WELL 29 is usefully formed using impurity ions that provide deep acceptor levels lying in the range of at least about 100 milli-electron volts above the valence band edge, more conveniently lying in the range of about 120 to 250 milli-electron volts above the valence band edge and preferably in the range of about 150 to 200 milli-electron volts above the valence band edge, but larger and smaller values may also be used. Indium (In) whose activation energy is about 160 milli-electron volts above the valence band edge is a preferred dopant for region 62 in silicon. Thallium (Tl) with activation energy of about 250 milli-electronic volts, and beryllium (Be) with activation energy of about 170 milli-electronic volts) are non-limiting examples of other impurities useful for forming doped region 62 in P-WELL 29, but other deep acceptors may also be used.

More generally, impurity ions for forming region 62 should provide acceptor levels such that there is a significant difference in magnitude of the acceptor ionization between about room temperature (e.g., ~300 Kelvin) and more elevated temperature when latch-up become a greater problem (e.g., ≥400 Kelvin). By way of example and not intended to be limiting, consider an impurity concentration for region 62 of about $1E17$ $cm^{-3}$ using an impurity providing a deep acceptor level about 150 milli-electron volts above the valence band edge. Then at 300 degrees Kelvin (about room temperature) such acceptors contribute about $4.7E16$ $cm^{-3}$ free carriers and at 400 degrees Kelvin such acceptors contribute about $7.8E16$ $cm^{-3}$ free carriers. This is a 65% increase in free carrier concentration in region 62 due to the deep acceptors for a temperature difference of about 100 degrees Kelvin, just in the temperature range where declining latch-up robustness has been encountered in the prior art. The conductivity of doped region 62 is directly related to the carrier concentration therein, so arranging for the carrier concentration to increase with temperature by providing deep acceptor ions that become more fully ionized with increasing temperature, makes region 62 more conductive as the temperature increases, thereby decreasing the parasitic bipolar transistor gain and making the associated CMOS device more latch-up robust. Stated another way, the concentration of deep acceptors in latch-up robustness enhancing region 62 relative to the background acceptor concentration should be large enough so that the conductivity of region 62 desirably increases by at least about 5%, more conveniently by at least about 10% and preferably by at least about 30%, between about 300 and 400 degrees Kelvin.

The change in carrier concentration with temperature in region 62 described above arrests the increase in parasitic NPN transistor gain (and therefore the propensity for latch-up) observed in prior art CMOS devices 20 of FIG. 1 that lack region 62. This can be seen by comparing trace 53 of FIG. 2 for prior art device 20 without region 62 with traces 54, 55 of FIG. 2 for CMOS device 60 of FIG. 3 according to embodiments of the present invention. When region 62 doped with deep acceptors such as have been described above is present, the gain of parasitic NPN transistor 45 actually decreases with increasing temperature as shown by traces 54, 55 of FIG. 2. This substantially improves the latch-up robustness at increasing temperature of CMOS device 60 of FIG. 3 compared to otherwise substantially similar prior art CMOS device 20 of FIG. 1. This is a significant improvement in the art. Referring again to FIG. 2, trace 55 corresponds to region 62 having four times the doping for trace 54. This shows not only that the beneficial effect of deep acceptor doped region 62 increases with increasing deep acceptor concentration in region 62 but also that decreasing parasitic transistor gain and improved latch-up robustness can be obtained for a wide range of deep acceptor concentrations in region 62. This greatly facilitates a wide range of design and manufacturing choices for CMOS devices with improved latch-up robustness.

Figure 4:
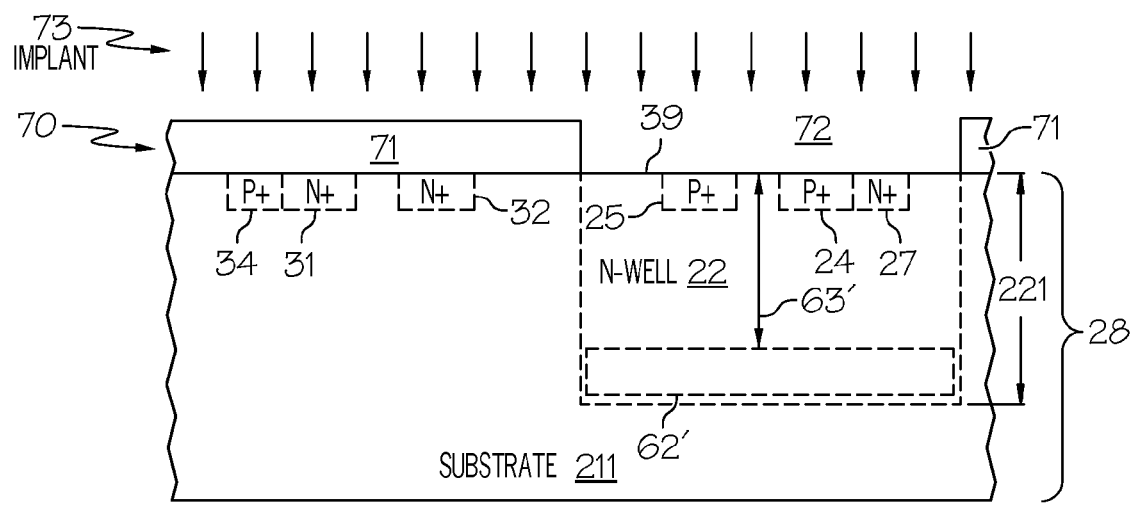
FIG. 4 shows a simplified cross-sectional view of a portion of a CMOS device analogous to that illustrated in FIG. 3 during an intermediate manufacturing stage wherein a robustness improving doped region is being created in connection with an N-WELL, according to a further embodiment of the invention.

FIG. 4 shows a simplified cross-sectional view of portion 601 of CMOS device 61 analogous to device 60 of FIG. 3 during an intermediate manufacturing stage wherein robustness enhancement region 62' is being created at depth 63' below surface 39, conveniently in connection with forming N-WELL 22, according to a further embodiment of the invention. In other embodiments, region 62' and N-WELL 22 may be formed separately. Either arrangement is useful. The manufacturing stage illustrated in FIG. 4 may be performed substantially at any time in the manufacturing process, but preferably in conjunction with the lithography step used for forming N-WELL 22. The location of sources 24, 32, drains 25, 32, and WELL contacts 34, 27 are indicated in dashed outline in FIG. 4 merely to indicate the relative location thereof with respect to N-WELL 22 and robustness enhancement region 62' and not to imply that they have already been provided in SC body 28 at this stage of manufacture although that is not precluded. Sources 24, 32, drains 25, 32, and WELL contacts 34, 27 may be provided before or after the formation of N-WELL region 22 and region 62'. N-WELL region 22 is formed in SC body 28 above substrate 211. Substrate 211 may be of any resistivity dictated by the needs of the device or integrated circuit being implemented. In a preferred embodiment, 10 Ohm-cm P-type material is convenient but higher and lower values and other conductivity type may also be used, as well as insulating or layered substrates.

The same general considerations regarding activation energies and ionizations levels described in connection with P-type region 62 of FIG. 3 apply to the dopant forming N-type region 62' except that for region 62' the dopants are deep donors rather than deep acceptors. It is found that region 62' in N-WELL 22 is usefully formed using impurity ions that provide deep donor levels lying in the range of at least about 100 milli-electron volts below the conduction band edge, more conveniently lying in the range of about 120 to 250 milli-electron volts below the conduction band edge and preferably in the range of about 150 to 200 milli-electron volts below the conduction band edge, but larger and smaller values may also be used. Tantalum (Ta) with activation energy of about 140 milli-electronic volts, tellurium (Te) with activation energy of about 200 milli-electronic volts and tin (Sn) with activation energy of about 250 milli-electronic volts are non-limiting examples of donor impurities useful for forming doped region 62' in N-WELL 22, but other deep donors may also be used. As indicated in FIG. 4, mask 70 is provided on surface 39 of SC body 28, having closed regions 71 and opening 72 corresponding substantially to the location and lateral extent of N-WELL 22 and latch-up robustness enhancing region 62'. In a preferred embodiment, Implant 73 including both conventional N-type dopants and deep donors is provided through mask opening 72 to form N-WELL region 22 and latch-up robustness enhancing region 62'. By way of example and not intended to be limiting, for N-WELL region 22 conventionally formed by implanting phosphorous (P) or arsenic (As) or both, when region 62' is to be included, the overall phosphorous and/or arsenic dose can be reduced when the deep donor ions making up region 62' are added. About 1E13 to 5E14 ions/cm$^2$ at about 100 to 300 keV are non-limiting examples of suitable total donor doses, but larger and smaller values may also be used, depending upon the desired device properties and the SC material being used. Such choices are within the competence of those of skill in the art. The dose of deep donor latch-up robustness enhancing ions for region 62' are usefully in the range of about 10 to 70 percent of the total donor ions provided in N-WELL region 22 and region 62' combined, more conveniently in the range of about 20 to 60 percent and preferably in the range of about 30 to 50 percent of the total donor ions provided, but larger and smaller values may also be used. Depth 63' should be at least great enough that region 62' underlies source 24, drain 25 and WELL contact 27 and may be as large or larger than depth 221 of N-WELL region 22. Region 62' is located usefully at about 20 to 100 percent of depth 221 of N-WELL 22, more conveniently about 30 to 100 percent of depth 221 and preferably about 40 to 100 percent of depth 221 of N-WELL 22, but larger and smaller depths may also be utilized.

Figure 5:
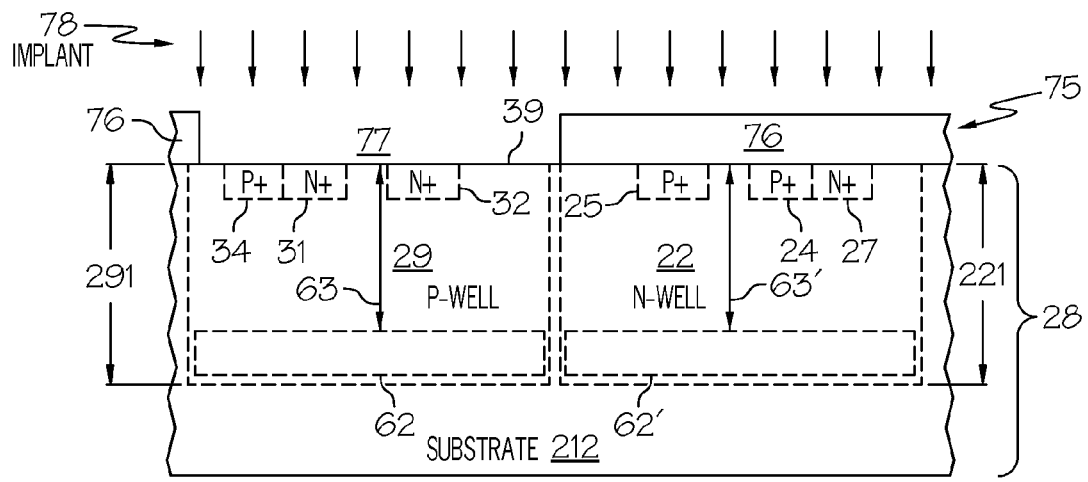
FIG. 5 shows a simplified cross-sectional view of a portion of a CMOS device analogous to that illustrated in FIG. 3 during another intermediate manufacturing stage wherein a robustness improving doped region is being created in connection with a P-WELL, according to a still further embodiment of the invention.

FIG. 5 shows a simplified cross-sectional view of portion 602 of CMOS device 61 analogous to that illustrated in FIG. 3 during a further intermediate manufacturing stage wherein robustness improving buried region 62 is being created at depth 63 below surface 39 in connection with forming P-WELL 29, according to a still further embodiment of the invention. In other embodiments, region 62 and P-WELL 29 may be formed separately. Either arrangement is useful. In the examples of FIGS. 3 and 5, P-WELL 29 is continuous with substrate 21, 212 in the sense that no PN junction exists therebetween, but P-WELL 29 is separately identified from substrate 21, 212 since its doping is often different than that of substrate 21, 212. Accordingly, the terms "WELL" or "WELL region", singular or plural, are used throughout to refer to the SC regions in which the MOSFET source-drain and WELL contact regions are located, irrespective of whether or not such WELLs or WELL regions are separated from the underlying substrate by a PN junction or other isolating structure.

In the manufacturing stage illustrated in FIG. 5 in which P-WELL 29 and latch-up robustness enhancing region 62 are being formed, it is presumed that N-WELL 22 and latch-up robustness enhancing region 62' have already been provided, but this is not essential and they may be provided in either order or only P-WELL 29 and region 62 may be provided. The manufacturing stage illustrated in FIG. 5 may be performed substantially at any time in the manufacturing process, but preferably in conjunction with the lithography step used for forming P-WELL 29. The location of sources 24, 32, drains 25, 32, and WELL contacts 34, 27 are indicated in dashed outline in FIG. 5 merely to indicate the relative location thereof with respect to P-WELL 29 and robustness enhancement region 62 and not to imply that they have already been provided in SC body 28 at this stage of manufacture although that is not precluded. Sources 24, 32, drains 25, 32, and WELL contacts 34, 27 may be provided before or after the formation of P-WELL region 29 and region 62. P-WELL region 29 and region 62 are formed in SC body 28 above substrate 212. Substrate 212 may be of a resistivity dictated by the needs of the device or integrated circuit being implemented. In a preferred embodiment, 10 Ohm-cm P-type material is convenient but higher and lower values and other conductivity type may also be used, as well as insulating or layered substrates. The general considerations with respect to the choice of deep acceptors useful for forming region 62 have already been discussed in connection with the description of FIG. 3, and such discussion is incorporated herein by reference.

As indicated in FIG. 5, mask 75 is provided on surface 39 of SC body 28, having closed regions 76 and opening 77 corresponding substantially to the location and lateral extent of P-WELL 29 and latch-up robustness enhancing region 62. In a preferred embodiment, Implant 78 is provided through mask opening 77 to form P-WELL region 29 using conventional acceptor dopants and latch-up robustness enhancing region 62 using deep acceptor dopants such as have been discussed earlier. By way of example and not intended to be limiting, for P-WELL region 29 conventionally formed by implanting boron (B), when region 62 is to be included, the overall boron dose can be reduced when the deep acceptor ions making up region 62 are added. About 1E13 to 5E14 ions/cm$^2$ at about 40 to 200 keV are non-limiting examples of suitable total acceptor doses, but larger and smaller values may also be used, depending upon the desired device properties and the SC material being used. Such choices are within the competence of those of skill in the art. The dose of deep acceptor latch-up robustness enhancing ions of region 62 are usefully in the range of about 10 to 70 percent of the total acceptor ions provided in P-WELL region 29 and region 62 combined, more conveniently in the range of about 20 to 60 percent and preferably in the range of about 30 to 50 percent of the total acceptor ions provided, but larger and smaller values may also be used. Depth 63 should be at least large enough that region 62 underlies and is spaced in depth from source 31, drain 32 and WELL contact 34. Depth 63 may be as large as or larger than depth 291 of P-WELL region 29. Region 62 is located usefully about 20 to 150 percent of depth 291 of P-WELL 29, more conveniently about 30 to 130 percent of depth 291 and preferably about 40 to 110 percent of depth 291 of P-WELL 29, but larger and smaller depths may also be utilized.

Figure 6:
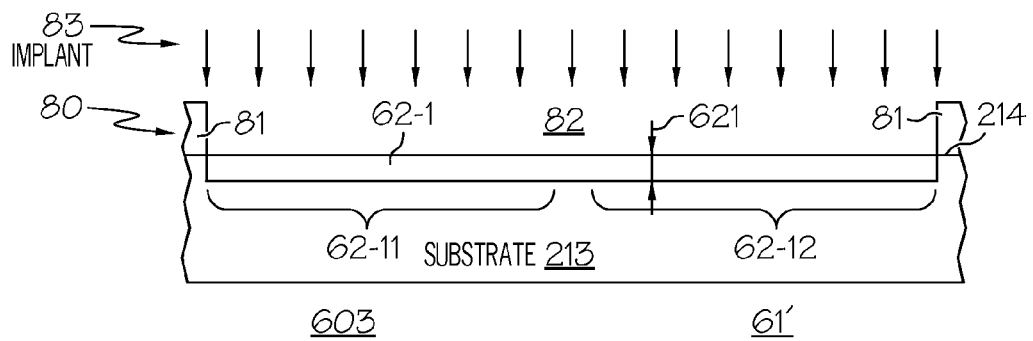
FIGS. 6-7 show a simplified cross-sectional views of a portion of a CMOS device analogous to that illustrated in FIG. 3 during still further intermediate manufacturing stages wherein a latch-up robustness improving doped region is being created, according to a yet further embodiment of the invention.
Figure 7:
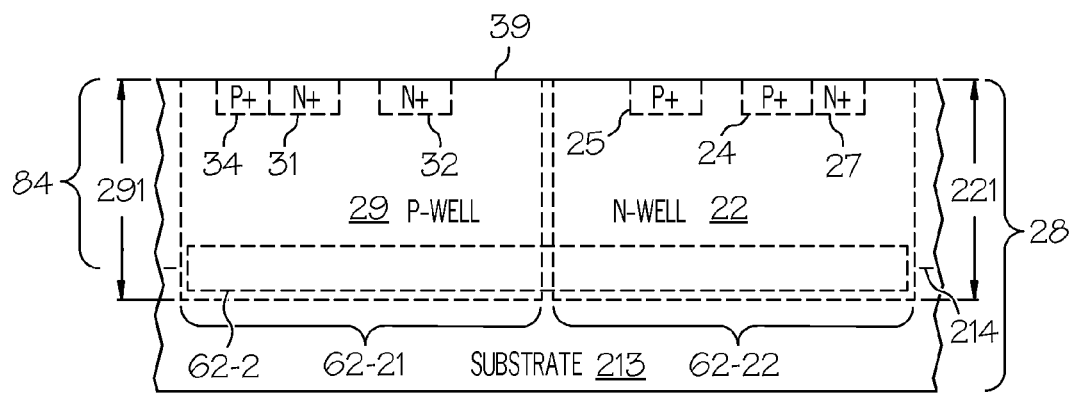

FIGS. 6-7 show a simplified cross-sectional views of portion 603 of CMOS device 61' analogous to device 60 and portions 601, 602 illustrated in FIGS. 3-5, during still further intermediate manufacturing stages wherein latch-up robustness improving buried region 62-2 is being created (see FIG. 7), according to a yet further embodiment of the invention. FIGS. 6 and 7 are discussed together. Referring now to the manufacturing stage illustrated in FIG. 6, substrate 213 is provided having upper surface 214. Mask 80 is provided on surface 214 of substrate 213. Closed portions 81 and opening 82 of mask 80 substantially define the lateral extent and location of latch-up robustness improving buried doped region 62-2 of FIG. 7. Implant 83 is provided in FIG. 6 through mask opening 82 to depth 621 in substrate 213 usefully adjacent to surface 214, although that is not required. In this example, it is presumed that deep acceptor ions analogous to those used for region 62 of FIG. 3 are provided in region 62-1 of FIG. 6, and the discussion thereof in connection with FIGS. 3 and 5 is incorporated herein by reference. In FIG. 7, mask 80 is removed and epitaxial region 84 having upper surface 39' is grown on surface 214 of substrate 213. WELL regions 22, 29 are subsequently formed in epitaxial region 84, with latch-up robustness enhancing region 62-2 located proximate former surface 214. While region 62-2 is shown in FIG. 7 as being, at or near the lower boundaries of WELL regions 22, 29, region 62-2 may be located in depth anywhere with respect to WELL regions 22, 29, as has already been discussed in connection with FIGS. 3-5. As with FIGS. 4-5, the location of sources 24, 32, drains 25, 32, and WELL contacts 34, 27 are indicated in dashed outline in FIG. 7 merely to indicate the relative location thereof with respect to WELLs 22, 29 and robustness enhancing region 62-2 and not to imply that they have already been provided in SC body 28 at this stage of manufacture although that is not precluded. The manufacturing stages illustrated in FIGS. 6-7 may be provided substantially at any time in the manufacturing process, but preferably relatively early in the manufacturing process, for example, before formation of the related WELL regions.

While the manufacturing stages illustrated in FIGS. 6-7 show how robustness enhancement region 62-2 with deep acceptor ions may be providing extending across both WELL regions 22, 29, persons of skill in the art will understand that in other embodiments in which mask 80 is appropriately modified, implanted region 62-1 and resulting region 62-2 may be limited to only one of WELL regions 22, 29 or provided separately for both WELL regions 22, 29. For example, by modifying mask 80 so that opening 82 overlies only the location of N-WELL region 22 and by providing deep donor ions into portion 62-12 of implant region 62-1 under such modified opening, then region 62-22 equivalent to region 62' of FIG. 4 may be provided. By modifying mask 80 so that opening 82 overlies only the location of P-WELL region 29 and by providing deep acceptor ions into portion 62-11 of implant region 62-1 under such modified opening, then region 62-21 equivalent to region 62 may be provided. Further, two masking and implant steps may be used, one implanting (e.g., deep acceptors) into location 62-11 of FIG. 6 and another implanting (e.g., deep donors) into location 62-12 of FIG. 6, followed by epitaxial growth of SC region 84 there-over as in FIG. 7. As a result, deep acceptor doped region 62-21 equivalent to region 62 of FIG. 5 and deep donor region 62-22 equivalent to region 62' of FIG. 5 are formed (e.g., see FIG. 7), either separately or along with one or both of their associated WELL regions which may be provided by doping SC body 28 after growth of epitaxial region 84. All of the foregoing embodiments are useful depending upon the desired CMOS device properties and the capabilities of the manufacturing line being used.

Figure 8:
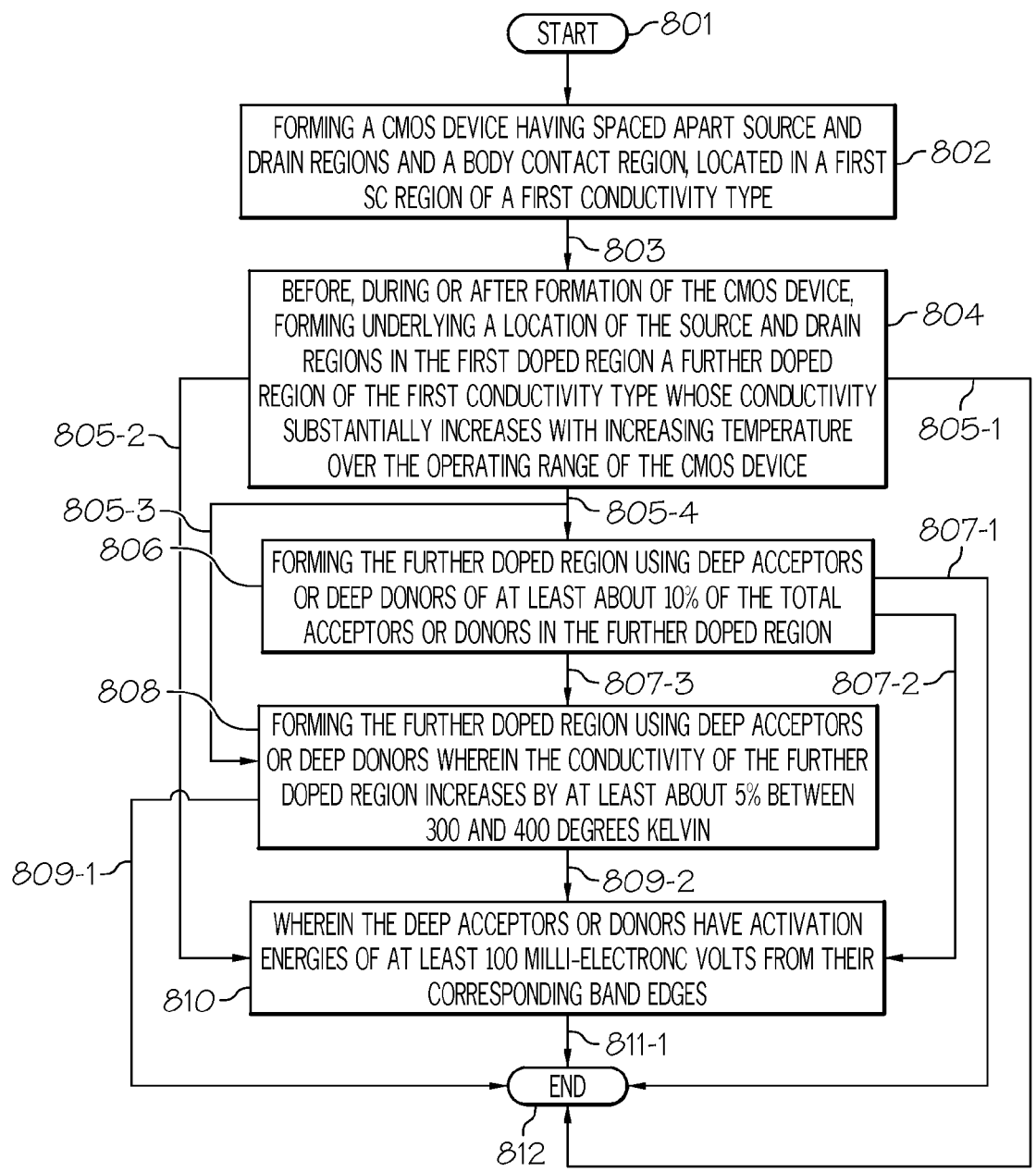
FIG. 8 shows simplified block diagrams of methods for fabricating the illustrative CMOS devices of FIGS. 3-7 individually or as part of an IC, according to still yet further embodiments of the invention.

FIG. 8 shows a simplified block diagram of method 800 for fabricating the illustrative CMOS devices of FIGS. 3-7 individually or as part of ICs, according to still yet further embodiments of the invention. Method 800 begins with START 801 and initial method block 802 wherein there is formed a CMOS device (60, 61, 61') having spaced apart source (24 or 31) and drain (25 or 32) regions and a body contact region (27 or 34), located in a first semiconductor (SC) region (22 or 29) of a first conductivity type (N or P). In method block 804 there is formed underlying a location of the source (24 or 31) and drain (25 or 32) regions in the first doped region (22, 29), before or after or during formation of the CMOS device (60, 61, 61'), a further doped region (62, 62', 62-2) of the first conductivity type whose conductivity substantially increases with increasing temperature over the operating range of the CMOS device. Several embodiments flow from step 804, for example: Embodiment (a) from method block 804 via path 805-1 to end 812; Embodiment (b) from method block 804 via path 805-2 to method block 810 and via path 811-1 to END 812; Embodiment (c) from method block 804 via path 805-3 to method block 808 and via path 809-1 to END 812; Embodiment (d) from method block 804 via path 805-3 to method block 808 and via path 809-2 to method block 810 and via path 811-1 to END 812; Embodiment (e) from method block 804 via path 805-4 to method block 806 and via path 807-1 to END 812; Embodiment (f) from method block 804 via path 805-4 to method block 806 and via path 807-2 to method block 810 and via path 811-1 to END 812; Embodiment (g) from method block 804 via path 805-4 to method block 806 and via path 807-3 to method block 808 and via path 809-1 to END 812; and Embodiment (h) from method block 804 via path 805-4 to method block 806 and via path 807-3 to method block 808 and via path 809-2 to method block 810 and via path 811-1 to END 812. All such embodiments are useful.

In method block 806 the further doped region (62, 62', 62-2) is formed using deep acceptors or deep donors of at least about 10% of the total acceptors or donors in the further doped region (62, 62', 62-2). In method block 808, the further doped region (62, 62', 62-2) is formed using deep acceptors or donor wherein the conductivity of the further doped region (62,62', 62-2) increases by at least about 5% between 300 and 400 degrees Kelvin. In block 810, the further doped region (62, 62' or 62-2) is formed using deep acceptors or deep donors having activation energies of at least about 100 millielectron volts from their respective band edges, e.g., from the valence band for acceptors and from the conduction band for donors. In, Tl, Be and combinations thereof are non-limiting examples of deep acceptors and Ta, Te, Sn and combinations thereof are non-limiting examples of deep donors.

While at least one exemplary embodiment has been presented in the foregoing detailed description of the invention, it should be appreciated that a vast number of variations exist. For example, persons of skill in the art will understand based on the explanations herein that latch-up robustness enhancing regions 62, 62', 62-2 may underlie the source-drain regions and body contacts of either or both MOSFETS 23, 30 shown in FIG. 3. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described and methods of preparation in an exemplary embodiment without departing from the scope of the invention as set forth in the appended claims and their legal equivalents.

What is claimed is:

1. A CMOS device is provided comprising:
   a first semiconductor (SC) region of a first conductivity type extending to a first surface and defining a first doped region;
   spaced apart source and drain regions in the first semiconductor region and of a second, opposite, conductivity type;
   a body contact region in the first semiconductor region and of the first conductivity type; and
   a further doped region of the first conductivity type located in the first doped region, spaced apart from and underlying the source and drain regions and the body contact region such that the source and drain regions and the body contact region are isolated from the further doped region, the further doped region having deep donors that become more fully ionized with increasing temperature such that over the operating temperature range of the device the conductivity of the further doped region substantially increases in response to the increasing temperature, wherein the deep donors comprise from 30 to 50% of the total donors in the first doped region, and wherein the deep donors are selected from the group consisting of Ta, Te, Sn, and combinations thereof.

2. The CMOS device of claim 1, wherein the deep donors have activation energies of at least 100 milli-electron volts from their corresponding band edges.

3. The CMOS device of claim 1, wherein the further doped region comprises the deep donors whose ionization causes the conductivity of the further doped region to increase by at least about 5% between about 300 and 400 degrees Kelvin.

4. The CMOS device of claim 1, wherein the further doped region is also doped with phosphorous or arsenic or a combination thereof.

5. A CMOS device is provided comprising:
a first semiconductor (SC) region of a first conductivity type extending to a first surface and defining a first doped region;
spaced-apart source and drain regions of a second, opposite, conductivity type located in the first semiconductor region; and
a body contact region of the first conductivity type located in the first semiconductor region; and
a further doped region of the first conductivity type located in the first doped region, spaced apart from and underlying the source and drain regions and the body contact region such that the source and drain regions and the body contact region are isolated from the further doped region, the further doped region comprising deep acceptors that become more fully ionized with increasing temperature such that the conductivity of the further doped region substantially increases over the operating temperature range of the device in response to the increasing temperature, wherein the deep acceptors comprise from 30 to 50% of the total acceptors in the first doped region, and wherein the deep acceptors are selected from the group consisting of In, Tl, Be, and combinations thereof.

6. The CMOS device of claim 5, wherein the deep acceptors have activation energies of at least 100 milli-electron volts from the valence band edge.

7. The CMOS device of claim 5, wherein the further doped region comprises the deep acceptors whose ionization causes the conductivity of the further doped region to increase by at least about 5% between about 300 and 400 degrees Kelvin.

8. The CMOS device of claim 5, wherein the further doped region is doped with indium.

9. The CMOS device of claim 8, wherein the further doped region also comprises boron.

10. A method for forming CMOS devices having improved latch-up robustness, comprising:
providing one or more WELL regions underlying locations of source-drains and body contacts of the CMOS devices;
including with the one or more WELL regions one or more further doped regions doped with deep acceptors or deep donors or both of the same conductivity type as the WELL regions spaced apart from and underlying the locations of the source-drains and body contacts such that the source and drain regions and the body contact region are isolated from the further doped region, wherein the one or more further doped regions become more fully ionized with increasing temperature such that the conductivity of the one or more further regions substantially increase over the operating temperature range of the CMOS devices in response to the increasing temperature, wherein one of the further doped regions is doped with the deep acceptors that become more fully ionized with increasing the temperature, wherein the deep acceptors comprise from 30 to 50% of the total acceptors in the corresponding WELL region, and wherein the deep acceptors are selected from the group consisting of In, Tl, Be, and combinations thereof.

11. The method of claim 10, wherein providing comprises:
providing the one or more WELL regions of a first conductivity type extending from a first surface;
forming, substantially at the first surface, spaced apart source and drain regions in the first semiconductor (SC) region and of a second, opposite, conductivity type; and
forming a body contact region substantially at the first surface in the first semiconductor (SC) region and of the first conductivity type.

12. The method of claim 11, further comprising:
forming the further doped region of the first conductivity type located in the one or more WELL regions, underlying the locations of the source and drain regions and the body contact region, and wherein:
(i) the further doped region has the deep acceptors or the deep donors providing conductivity of the further doped region that increases by at least 5% between about 300 and 400 degrees Kelvin.

13. The CMOS device of claim 12, wherein the deep acceptors and the deep donors are chosen from a group having activation energies of at least 100 milli-electron volts from their corresponding band edges.

* * * * *